US006402545B1

(12) United States Patent
Huang

(10) Patent No.: US 6,402,545 B1
(45) Date of Patent: Jun. 11, 2002

(54) FLAT CABLE CONNECTOR

(75) Inventor: Chien-Pin Huang, Taipei (TW)

(73) Assignee: Guann Tau International Corp., Taipei (TW)

( * ) Notice: Subject to any disclaimer, the term of this patent is extended or adjusted under 35 U.S.C. 154(b) by 0 days.

(21) Appl. No.: 09/796,626

(22) Filed: Mar. 2, 2001

(30) Foreign Application Priority Data

Jul. 7, 2000 (TW) ...................................... 89211727 U

(51) Int. Cl.[7] .................................................. G01R 4/24
(52) U.S. Cl. ....................................... 439/418; 439/676
(58) Field of Search ................................ 439/418, 676, 439/495, 496, 492, 499, 809

(56) References Cited

U.S. PATENT DOCUMENTS 5,147,215 A * 9/1992 Pritulsky .................... 439/344
5,830,005 A * 11/1998 Watanabe ................... 439/418
5,906,503 A * 5/1999 Wiencek et al. ............ 439/418

* cited by examiner

*Primary Examiner*—P. Austin Bradley
*Assistant Examiner*—Alexander Gilman
(74) *Attorney, Agent, or Firm*—Bacon & Thomas, PLLC

(57) ABSTRACT

A flat cable connector. The flat cable connector includes a main body and a connecting seat. The connecting seat has a plurality of lead grooves at one end thereof into which leads of the flat cable are engaged. A connecting seat is thereafter inserted into a main body so that the leads and terminals of the main body are joined together. Since the assembly of the leads in the lead grooves is in a way of side engagement so that a more rapid, convenient, time-saving and work-saving assembly is achieved and the production cost is therefore reduced, especially for the flat cable composed of extremely thin leads.

2 Claims, 5 Drawing Sheets

FLAT CABLE CONNECTOR

BACKGROUND OF THE INVENTION

1. Field of the Invention

The present invention relates to a flat cable connector, and more particularly, to a flat cable connector having a plurality of lead grooves into which leads of the flat cable are engaged. A connecting seat is thereafter inserted into a main body so that the leads and terminals of the main body are joined together for reaching an easy, time-saving and work-saving assembly.

2. Description of the Prior Art

In a conventional flat cable connector, as shown in FIG. 1, leads of a flat cable 300 are respectively inserted in guide grooves 2001 of a connector 200, whereupon the connector 200 is secured to a main body 100 such that terminals on the main body 100 is in contact with the leads, thereby creating a closed circuit.

However, the aforementioned flat cable connector has its drawbacks as follows:

1. The assembly of the leads is in an inserting way so that it's difficult, time-wasting and work-wasting.
2. As the leads are assembled in an inserting way so that the thinner and softer flat cable can hardly be inserted smoothly. Accordingly, the processing work is more difficult.

SUMMARY OF THE INVENTION

It is a primary object of the present invention to eliminate the aforementioned drawbacks and to provide a flat cable connector whose connecting seat includes a plurality of lead grooves with openings so that the leads are assembled in a way of side engagement. Accordingly, an easy and convenient assembly is attainable.

It is another object of the present invention to provide a flat cable connector in which the leads are assembled in a way of side engagement so that extremely thin and soft leads can be smoothly assembled.

BRIEF DESCRIPTION OF THE DRAWINGS

The drawings disclose illustrative an embodiment of the present invention which serves to exemplify the various advantages and objects hereof, and are as follows.

DETAILED DESCRIPTION OF THE PREFERRED EMBODIMENT

Figure 1:
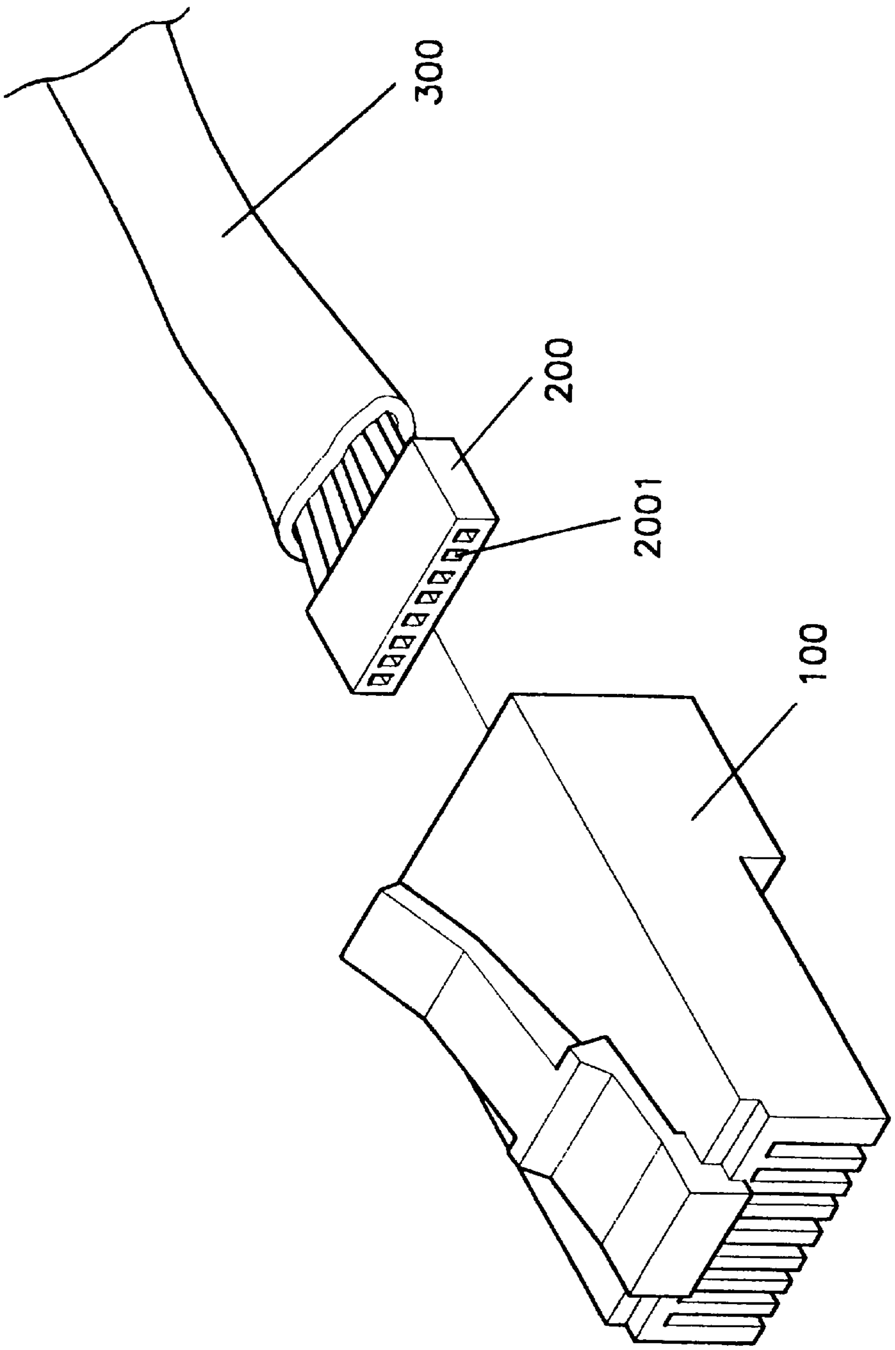
Fig. 1 PRIOR ART
FIG. 1 is a perspective view of a conventional flat cable connector.
Figure 2:
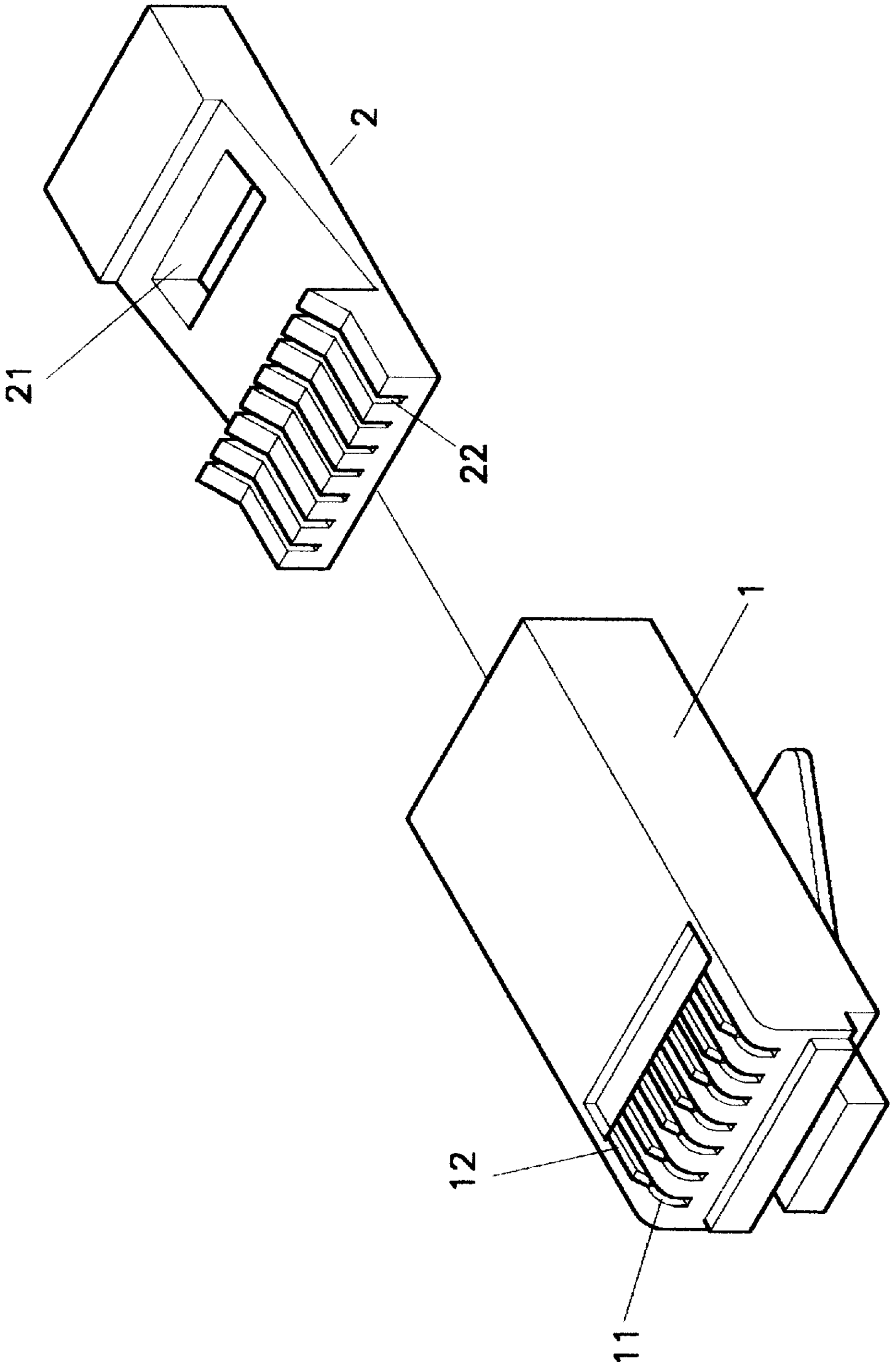
FIG. 2 is a perspective exploded view of a preferred embodiment of the present invention.

Referring to FIG. 2, the flat cable connector in accordance with the present invention at least includes a main body 1 and a connecting seat 2. The main body 1 constructed as a hollow body has a plurality of grooves 11 at one end of the top side thereof in each of which a terminal 12 is disposed. The connecting seat 2 includes a through hole 21 at a proper position thereof and a plurality of lead grooves 22 at one end thereof while the position of the lead grooves 22 corresponds to that of the terminals 12.

Figure 3:
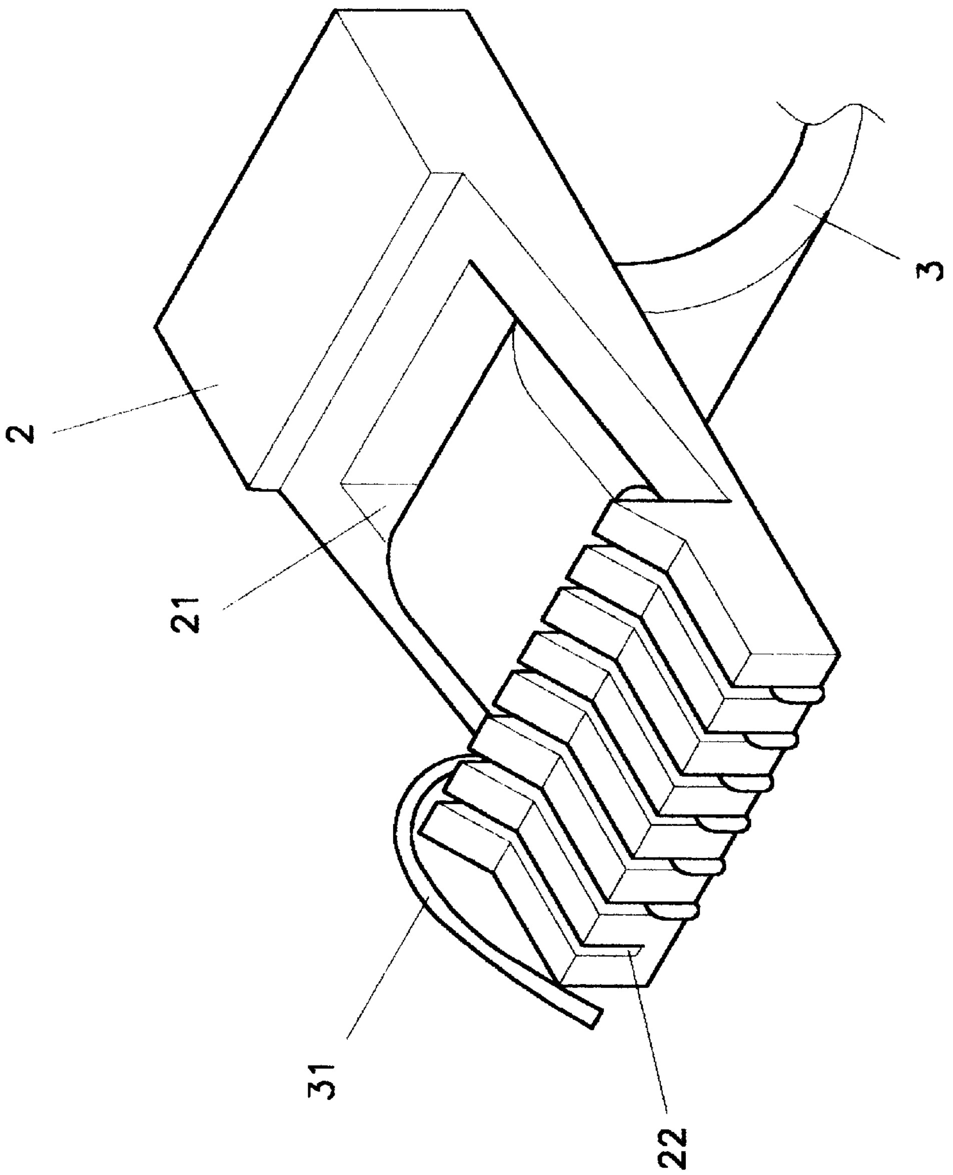
FIG. 3 is a perspective view of the assembly of a connecting seat and a flat cable of the preferred embodiment of the present invention.
Figure 4:
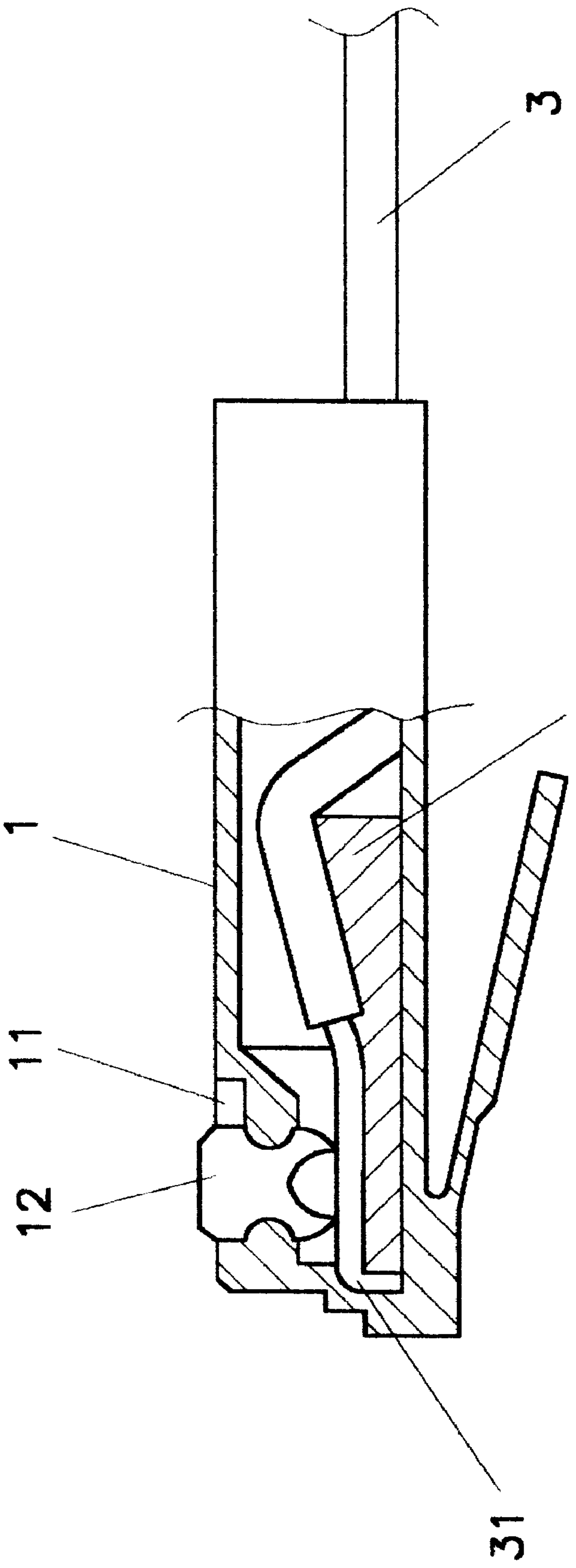
FIG. 4 is a sectional view of the preferred embodiment of the present invention.

In reference to FIG. 3 together with FIG. 4, a flat cable 3 passes from the bottom of the connecting seat 2 through the through hole 21 while leads 31 of the flat cable 3 are respectively engaged into the corresponding lead grooves 22. Thereafter, the leads 31 are bent at the end of the connecting seat 2. Then, the connecting seat 2 is inserted in the main body 1 in such a way that the leads 31 are in contact with the terminals 12 so that a closed circuit is created.

Figure 5:
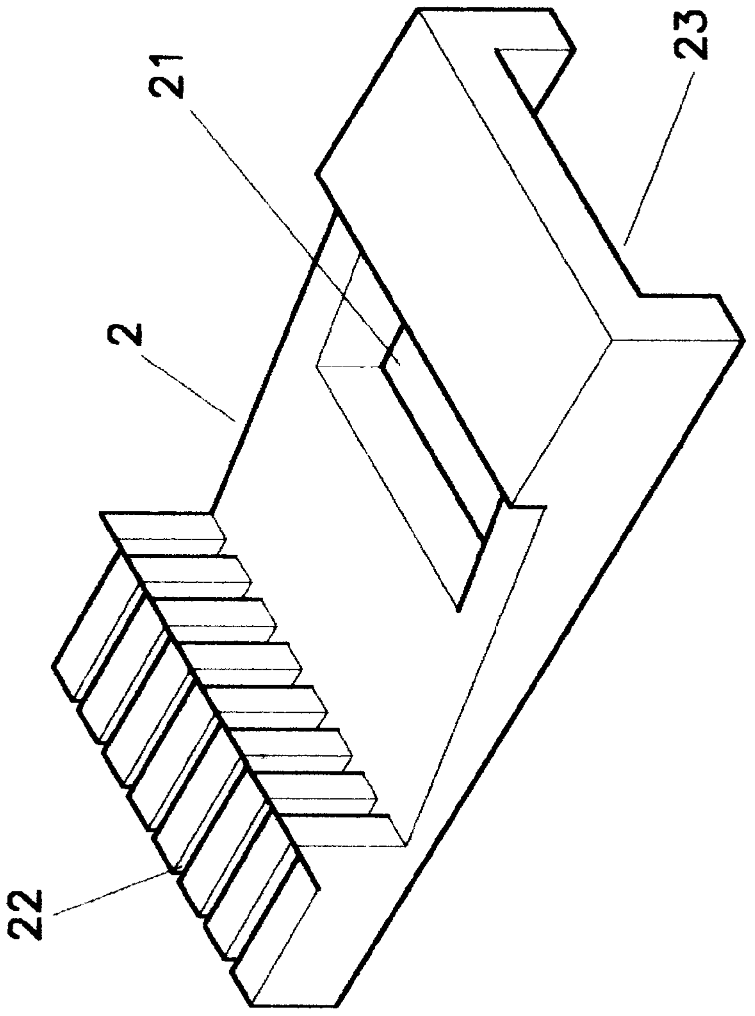
FIG. 5 is a perspective view of the connecting seat of the present invention.

FIG. 5 shows a perspective view of the connecting seat of the present invention. A bottom groove 23 connected with the through hole 21 is arrange at the bottom of the connecting seat 2, and it is used to receive the flat cable of a greater thickness.

Many changes and modifications in the above-described embodiments of the invention can, of course, be carried out without departing from the scope thereof. Accordingly, to promote the progress in science and the useful arts, the invention is disclosed and is intended to be limited only by the scope of the appended claims.

What is claimed is:

1. A flat cable connector comprising:

a main body comprising a hollow case having a main opening, a plurality of grooves positioned at an end portion thereof substantially opposite that of the main opening, a plurality of terminals attached to the main body, each of the terminals positioned above a respective one of the grooves;

a connecting seat having a through hole extending through upper and lower sides thereof, a plurality of lead grooves positioned at an insertion portion thereof, each of the grooves corresponding to one of the terminals;

a flat cable comprising a plurality of leads extending out from an end thereof, the flat cable extended through the through hole of the connecting seat and each of the leads inserted into a corresponding one of the lead grooves, the leads are bent at the insertion portion of the connecting seat, substantially perpendicular to the lead grooves; and the flat cable attached to the connecting seat is positioned into the main body via the main opening thereof such that the leads of the flat cable are directly contacted by corresponding terminals of the main body to complete circuits between the terminals and the leads of the flat cable, and bent portions of the leads are secured between the main body and the insertion portion of the connecting seat.

2. The flat cable connector as claimed in claim 1, wherein the connecting seat further comprises a bottom groove adapted to receive the flat cable of varying thickness.

* * * * *